United States Patent
Mochizuki

(10) Patent No.: US 9,118,294 B2
(45) Date of Patent: Aug. 25, 2015

(54) RECEIVING DEVICE AND GAIN CONTROL METHOD

(75) Inventor: Takuji Mochizuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/131,167

(22) PCT Filed: Jul. 6, 2012

(86) PCT No.: PCT/JP2012/067334
§ 371 (c)(1),
(2), (4) Date: Jan. 6, 2014

(87) PCT Pub. No.: WO2013/008747
PCT Pub. Date: Jan. 17, 2013

(65) Prior Publication Data
US 2014/0133606 A1 May 15, 2014

(30) Foreign Application Priority Data

Jul. 8, 2011 (JP) ................................. 2011-151634

(51) Int. Cl.
*H04L 27/08* (2006.01)
*H03G 3/30* (2006.01)
(Continued)

(52) U.S. Cl.
CPC ........... *H03G 3/3036* (2013.01); *H03G 3/3052* (2013.01); *H03G 3/3068* (2013.01); *H04B 1/1027* (2013.01); *H04W 52/0245* (2013.01); *H04W 52/0229* (2013.01)

(58) Field of Classification Search
CPC .................... H04W 52/0245; H04W 52/0229; H03G 3/3052; H03G 3/3036; H03G 3/3068; H04B 1/1027; H04L 25/067

USPC ................................................... 375/340, 345
See application file for complete search history.

(56) References Cited

U.S. PATENT DOCUMENTS

| | | |
|---|---|---|
| 7,209,528 B2 | 4/2007 | Prater |
| 2001/0003536 A1 | 6/2001 | Kurihara |

(Continued)

FOREIGN PATENT DOCUMENTS

| | | |
|---|---|---|
| CN | 1545766 A | 11/2004 |
| CN | 1630209 A | 6/2005 |

(Continued)

OTHER PUBLICATIONS

International Search Report in PCT/JP2012/067334 dated Oct. 2, 2012 (English Translation Thereof).

(Continued)

*Primary Examiner* — Juan A Torres
(74) *Attorney, Agent, or Firm* — McGinn IP Law Group, PLLC

(57) ABSTRACT

A receiving device performs log noise amplification on radio waves (desired waves and interfering waves), received with an antenna, to generate a received signal, converts the received signal into an intermediate frequency signal, converts the intermediate signal into a digital signal, filters out and demodulates a frequency band of a specific channel from the digital signal. Herein, a first received signal strength (RSSI 1) is detected from the digital signal, while a second received signal strength (RSSI 2) is detected from the digital signal of the specific channel. The intermediate frequency signal is amplified with a first gain which is calculated by way of the comparative judgment on the first receive signal strength and the allowable threshold. The digital signal of the specific channel is amplified with a second gain.

10 Claims, 6 Drawing Sheets

(51) Int. Cl.
*H04B 1/10* (2006.01)
*H04W 52/02* (2009.01)

(56) References Cited

U.S. PATENT DOCUMENTS

| | | |
|---|---|---|
| 2002/0160734 A1 | 10/2002 | Li et al. |
| 2002/0163979 A1 | 11/2002 | Takatz et al. |
| 2003/0100279 A1* | 5/2003 | Medvid et al. ............. 455/164.2 |
| 2003/0194981 A1 | 10/2003 | Rimini et al. |
| 2004/0152429 A1* | 8/2004 | Haub et al. .................... 455/102 |
| 2005/0042994 A1* | 2/2005 | Otaka et al. ................ 455/180.3 |
| 2005/0129151 A1 | 6/2005 | Kobayashi et al. |
| 2005/0147192 A1 | 7/2005 | Yamamoto et al. |
| 2005/0208916 A1 | 9/2005 | Peterzell et al. |
| 2005/0208919 A1 | 9/2005 | Walker et al. |
| 2008/0014895 A1 | 1/2008 | Li et al. |
| 2008/0101215 A1 | 5/2008 | Tanaka et al. |
| 2009/0104951 A1* | 4/2009 | Nakatani et al. ........... 455/575.7 |
| 2009/0131005 A1* | 5/2009 | Kawagishi et al. ........ 455/226.2 |
| 2011/0065391 A1* | 3/2011 | Shiotsuki et al. ............ 455/63.4 |
| 2011/0105070 A1 | 5/2011 | Li et al. |
| 2014/0079166 A1* | 3/2014 | Kim et al. ..................... 375/347 |

FOREIGN PATENT DOCUMENTS

| | | |
|---|---|---|
| JP | 5-327540 A | 12/1993 |
| JP | 11-136153 A | 5/1999 |
| JP | 11-298348 A | 10/1999 |
| JP | 2000-68870 A | 3/2000 |
| JP | 2000-209118 A | 7/2000 |
| JP | 2001-57513 A | 2/2001 |
| JP | 2002-94408 A | 3/2002 |
| JP | 2005-151011 A | 6/2005 |
| JP | 2005-167860 A | 6/2005 |
| JP | 2005-333182 A | 12/2005 |
| JP | 2006-115345 A | 4/2006 |
| JP | 2007-19900 A | 1/2007 |
| JP | 2007-281633 A | 10/2007 |
| JP | 2008-193442 A | 8/2008 |
| JP | 2009-147616 A | 7/2009 |
| JP | 2009-268098 A | 11/2009 |
| JP | 2010-193489 A | 9/2010 |
| WO | WO 2007/032550 A1 | 3/2007 |

OTHER PUBLICATIONS

Extended European Search Report dated Feb. 19, 2015.
Chinese Office Action dated Jun. 3, 2015 with Search Report and an English translation thereof.
Japanese Notice of Allowance dated Jun. 23, 2015 with a partial English translation thereof.

* cited by examiner

RECEIVING DEVICE AND GAIN CONTROL METHOD

TECHNICAL FIELD

The present invention relates to a receiving device which converts radio waves received via an antenna into an intermediate frequency signal or an analog baseband signal, carries out analog-to-digital conversion, and then demodulates desired waves while attenuating interfering waves based on received signal strengths, and in particular to a gain control method of a receiving device which carries out automatic gain control to keep demodulator input levels of desired waves within an appropriate range irrespective of the existence or nonexistence of interfering waves, thus demodulating low-level desired waves close to reception sensitivities irrespective of the existence of strong interfering waves.

The present application claims priority based on Japanese Patent Application No. 2011-151634 filed Jul. 8, 2011, the entire content of which is incorporated herein by reference.

BACKGROUND ART

Conventionally, receiving devices, which receive radio waves including desired waves and interfering waves via antennas, carry out analog-to-digital conversion, extract desired waves by use of received signal strength indicators (RSSI), carry out digital demodulation, and carry out automatic gain control (AGC) to adjust the input levels of demodulators, have been developed and applied to base-station receiving devices in cellular and mobile communication systems, base-station receiving devices in fixed-line telecommunication networks, grand-station receiving devices in satellite communication systems, and broadcasting systems.

Patent Literature Document 1 discloses an automatic gain control method in a mobile orthogonal frequency division multiple access (OFDMA) network, which is characterized in that the power level of an analog baseband signal is adjusted based on the average power of cyclic prefixes which are calculated based on the received signal intensity. Patent Literature Document 2 discloses a receiving device which is able to substantially expand the dynamic range with the input and the output of an RSSI circuit, receive a wide range of signal levels, and transmit accurate reception levels. Patent Literature Document 3 discloses a receiving device preventing intermodulation, which reliably suppress intermodulation waves included in reception channels so as to effectively prevent a reduction of reception quality due to intermodulation. Patent Literature Document 4 discloses a broadcasting receiving device which effectively attenuates signal levels of interfering stations by use of AGC and RSSI so as to suppress received desired frequency signals from being reduced in levels. Patent Literature Document 5 discloses a receiving device which determines interfering waves based on RSSI of desired waves so as to change the linearity of a low-noise amplifier (LNA), thus reducing influences of interfering waves. Patent Literature Document 6 discloses an AGC circuit which applies an optimum gain to the power of desired waves irrespective of interfering waves being input to a receiver. Patent Literature Document 7 discloses a wireless cellular communication terminal which prevents wireless characteristics from being degraded by changing the capacitance of a capacitor connected to a detection and rectifier circuit depending on the existence or nonexistence of interfering waves or the magnitude of interfering waves. Patent Literature Document 8 discloses a receiver which carries out AGC and digital demodulation processes. Patent Literature Document 9 discloses a receiving device which carries out a software demodulation process without using AGC irrespective of fluctuations in reception levels. Patent Literature Document 10 discloses a receiver having an AGC circuit adapted to a digital CATV tuner, which is characterized by gaining optimum AGC characteristics irrespective of deviations of tuner's gains or deviations of gains between channels. Patent Literature Document 11 discloses a wireless receiving device which is able to reliably amplify desired signals while suppressing increasing power consumption at an RF frontend, which is characterized by using a DC-DC converter which controls power consumption of a low noise amplifier (LNA) based on the received signal strengths before and after a low pass filter. Patent Literature Document 12 discloses a receiving device employing a direct conversion system or a Low-IF system. Patent Literature Document 13 discloses a receiving module of a terrestrial digital television receiver which is able to suppress interfering waves due to unwanted waves of adjacent channels by applying AGC to an RF amplifier circuit based on the signal level after IF tuning. Patent Literature Document 14 discloses a receiving device having a high resistance against interfering waves, which determines the existence or nonexistence of interfering waves based on differences between RF input levels and IF input levels, thus improving a reception efficiency.

FIG. 4 shows a block diagram of a conventionally-known receiving device (see Patent Literature Document 2). The receiving device includes an antenna 1, a mixer 3, a local oscillator 4, an A/D converter 5, an analog variable gain function part 6, a channel selecting filter 8, a received signal strength indicator (RSSI) 9, a comparison controller 11, a demodulator 12, and a low noise amplifier (LNA) 13 with a variable gain function. The receiving device prevents saturation and secures backoff (i.e. a process needed to transmit modulation signals having peak components without distortions) in the analog-to-digital (A/D) converter 5 based on the direct conversion system, the single conversion system, or the multiple conversion system.

For this reason, the comparison controller 11 determines the level detected with the RSSI 9 (i.e. a circuit used to monitor the desired-wave level at the output side of the channel selecting filter 8) which is arranged at the output side of the A/D converter (ADC) 5, wherein the analog variable gain function part 6, arranged at the input part of the A/D converter 5, controls a gain reduction on desired waves exceeding the allowable threshold.

FIG. 5 is used to explain problems of the conventionally-known receiving device, wherein FIG. 5(a) is used to explain the level diagram and the AGC behavior in the case of the receiving device solely inputting desired waves, while FIG. 5(b) is used to explain the level diagram and the AGC behavior in the case of the receiving device inputting both low desired waves (close to the minimum sensitivity) and strong interfering waves.

When the level of a desired wave is increased from the minimum sensitivity in FIG. 5(a), the comparison controller 11 determines the level detected with the RSSI 9 in the AGC loop based on the level of a desired wave by use of a threshold, and therefore the analog variable gain function part 6 controls a gain reduction (−a [dB], −b [dB]) on a desired wave exceeding the threshold level in order to aim to prevent saturation and secure backoff in the A/D converter 5.

Since the level of a desired wave input to the demodulator 12 becomes higher than the minimum definition level in FIG. 5(a), it is possible to demodulate the desired wave while maintaining the carrier-to-noise (C/N) ratio to the noise level, which is needed to demodulate the desired wave. When a desired wave is solely input to the receiving device, it is possible to reduce the dynamic range which is required as the input level of the demodulator 12.

However, the following problem is raised when the receiving device receives a strong interfering wave and a low desired wave (close to the minimum sensitivity) as shown in FIG. 5(b). That is, when an interfering wave instead of a desired wave becomes dominant due to the increasing level of an interfering wave, the comparison controller 11 determines the level of an interfering wave detected with the RSSI 9 in the AGC loop, and therefore the analog variable gain function part 6 controls a gain reduction (−a [dB], −b [dB]) on the interfering wave whose level exceeds the threshold in order to aim to prevent saturation due to the interfering wave and to secure backoff in the A/D converter 5. In this case, the analog variable gain function part 6 controls a gain reduction (−a [dB], −b [dB]) on a low desired wave close to the minimum sensitivity similar to an interfering wave, and therefore the level of a desired wave will be decreased in the circuit portion subsequent to the A/D converter 5.

Additionally, due to a desired wave and an interfering wave passing through the channel selecting filter 8 following the analog-to-digital (A/D) converter 5, the level of an interfering wave is extremely attenuated and suppressed to be lower than the level of a desired wave, wherein the level of a desired wave input to the demodulator 12 remains lower than the minimum definition level as shown in FIG. 5(b), and therefore the original information is lost to cause extreme degradation of demodulation or disability of demodulation because the information of a desired wave below the minimum definition level of the demodulator 12 is cut out. the channel selecting filter 8 following the A/D converter 5, the level of an interfering wave is extremely attenuated and suppressed to be lower than the level of a desired wave, wherein the level of a desired wave input to the demodulator 12 remains lower than the minimum definition level as shown in FIG. 5(b), and therefore the original information is lost to cause extreme degradation of demodulation or disability of demodulation because the information of a desired wave below the minimum definition level of the demodulator 12 is cut out.

When the conventionally-known receiving device is used to receive and demodulate a low desired wave close to the minimum sensitivity along with a strong interfering wave, it is necessary to extremely increase the dynamic range necessary for the input level of the demodulator while increasing the number of bits necessary for the demodulator, thus increasing the circuit scale of the receiving device while increasing power consumption.

FIG. 6 shows a block diagram of another conventionally-known receiving device (see Patent Literature Document 1). The receiving device includes an analog block 22, an antenna 24, and a digital baseband part 32. The analog block 22 includes a band-pass filter (BPF) 26, a low noise amplifier (LNA) 28, a local oscillator (LO) 30, and amplifiers (VGA) 34, 36. The digital baseband part 32 includes a received signal strength indicator (RSSI) 38, a control logic part 40, and A/D converters 46, 48. Reference sign 42 shows enable pulses.

Patent Literature Document 4 discloses the receiving device which monitors and compares the levels before and after a channel selecting filter, which is arranged to suppress interfering waves, so as to compare the level difference and the allowable threshold, thus determining the existence or nonexistence of an interfering wave. Specifically, it is possible to determine the existence of an interfering wave due to a large difference between the levels before and after the channel selecting filter but to determine the nonexistence of an interfering wave due to a small difference between the levels.

For example, Patent Literature Document 4 discloses the broadcasting receiving device which determines that a small amount of radio waves (i.e. interfering waves) are being received via channels other than the currently serving channel due to a small difference between the levels before and after IF-BPF, and therefore it performs AGC via the current channel by controlling the gain of the variable-gain RF-AMP, preceding MIXER, based on the RSSI level before IF-BPF. On the other hand, the broadcasting receiving device determines that a large amount of radio waves are being received via channels other than the currently serving channel due to a large difference between the levels before and after IF-BPF, and therefore it performs AGC collectively via the other channels and the current channel by controlling the gain of the variable-gain RF-AMP, preceding MIXER, based on the level representing a plurality of reception channels which is calculated by subtracting the RSSI level after IF-BPF from the RSSI level before IF-BPF. Herein, it is possible to achieve an AGC function by applying a variable gain to RF-AMP in connection with desired waves which are detected with respect to the current channel alone or a plurality of channels including the current channel.

The present invention, which will be discussed later, detects the existence of a strong interfering wave based on a level difference of RSSI before the channel selecting filter while reducing the gain of the analog variable gain function part (i.e. a first AGC-controlled subject) preceding the A/D converter such that the output of the A/D converter, serving as an AGC-controlled subject in the minimum sensitivity reception and preceding channel selection, will not be distorted due to a strong interfering wave. In this case, the present invention increases the gain of the digital variable gain function part, serving as a second AGC-controlled subject, so as to correct the low level of a desired wave with the demodulation-enabled level.

Patent Literature Document 8 imports an idea into the AGC circuit including RSSI to receive desired waves with a wide range of levels even when high-level interfering waves are intermixed with desired waves. That is, it is possible to appropriately control the AGC gain entirely over the circuitry by activating an AGC operation by use of the processing result of the broadband RSSI1 based on the output of the A/D converter (ADC) reflecting desired waves and interfering waves and the processing result of the narrowband RSSI2 solely reflecting desired waves after being subjected to the band limitation of BPF following ADC. In this connection, Patent Literature Document 9 and Patent Literature Document 10 disclose prior art which aim at improvement of Patent Literature Document 8.

Patent Literature Document 8 discloses a method of extracting data by use of ADC at two points in different gain stages arranged in the reception IF system depending on the input level in consideration of the necessity of two systems for ADC.

Patent Literature Document 10 discloses a method of independently varying and controlling the AGC gain of RF (radio frequency) and the AGC gain of IF (intermediate frequency) in consideration of the gain control reference solely reflecting desired waves precluding interfering waves.

The first embodiment of Patent Literature Document 8 refers to the circuitry in which the broadband RSSI1 based on the ADC output reflecting desired waves and interfering waves is not interlocked with the narrowband RSSI2 based on the BPF output after ADC solely reflecting desired waves.

First, due to inputting of desired waves and interfering waves having significantly high levels, it is necessary to set a source voltage or a gain of LNA without exceeding the full scale of ADC by way of the determination of RSSI1. Due to inputting of further high-level signals, it is necessary to control and reduce the gain of the preceding digital IF amplifier by way of the determination of the level of desired waves with RSSI2.

For the above reason, it is necessary to perform the RSSI1 operation without causing saturation of ADC. However, it is necessary to apply a variable gain to the digital IF amplifier interposed between the BPF and the demodulator in the RSSI2 operation in order to keep desired waves before the demodulator within the predetermined level without determining the existence or nonexistence of interfering waves (cf. Patent Literature Document 10 in which RSSI solely operates). This results from an expectation in which that the determination of RSSI2 will be performed with the level of a desired wave on the assumption that the level of an interfering wave has been adequately reduced by way of the band-limiting BPF. The present invention needs to compare differences between RSSI1 and RSSI2 so as to estimate the existence or nonexistence of interfering waves, thus controlling the digital AGC gain.

The second embodiment of Patent Literature Document 8 refers to an AGC control method using both of RSSI1 and RSSI2. The second embodiment is designed to control and greatly reduce the gain of LNA to prevent AGC saturation with respect to the very low level of a desired wave and the very high level of an interfering wave, whereas it may raise the fear of degrading the reception sensitivity due to an unnecessary reduction in the level of a desired wave. To prevent this drawback, Patent Literature Document 8 discloses a correction method of preventing a rapid reduction in a control voltage applied to LNA in order to alleviate a significant reduction in the gain of LNA which is controlled via the processing result of RSSI1.

Patent Literature Document 11 discloses the technology similar to the technology of Patent Literature Document 5. It is possible to detect the existence of interfering waves and the levels of interfering waves by comparing differences between the level of RSSI1 (interfering waves+desired waves), preceding the analog baseband part including. MIXER through ADC or the band-limiting LPF arranged in the IF system and the level of a desired wave detected with RSSI2 following the LPF. It is necessary to control the voltage of a DC-DC converter used for LNA in order to prevent saturation of LNA, occurrence of distortion, and suppression of sensitivity (i.e. a phenomenon in which the gain or the desired-wave gain is decreased below the appropriate value due to gain compression caused by interfering waves) while improving the linearity of LNA when the strength of an interfering wave is being varied over time during reception of an interfering wave and a desired wave which are intermixed together.

Upon determining a high level of an interfering wave, it is possible to improve the saturation power of LNA (i.e. to expand the backoff) by boosting the control voltage of LNA. In contrast, upon determining a low level of an interfering wave, it is possible to prevent an increase of power consumption, which is necessary to constantly cope with interfering waves, by restoring the original control voltage of LNA.

Patent Literature Document 11 aims at improvement of Patent Literature Document 12. Patent Literature Document 12 aims to prevent an increase of power consumption which is necessary to constantly cope with interfering waves, wherein it determines the existence or nonexistence of interfering waves by detecting a difference of RSSI at two points, and it copes with high-level interfering waves by changing the paths regarding the LNA and the analog baseband part in the direct conversion system.

It is possible to determine the existence or nonexistence of interfering waves based on a difference between RSSI1 representing the RF output of the LNA reflecting interfering waves and desired waves and RSSI2 regarding the output of the digital baseband part solely reflecting desired waves, transmitted through the channel filter, after ADC. In this connection, it is possible to secure a net gain by arranging the digital AGC amplifier before ADC irrespective of a gain correction when the LNA is bypassed upon detecting interfering waves above the allowable value.

CITATION LIST

Patent Literature Document

Patent Literature Document 1: Japanese Patent Application Publication No. 2009-268098
Patent Literature Document 2: Japanese Patent Application Publication No. 2002-94408
Patent Literature Document 3: Japanese Patent Application Publication No. 2000-68870
Patent Literature Document 4: Japanese Patent Application Publication No. 2007-19900
Patent Literature Document 5: Japanese Patent Application Publication No. H11-298348
Patent Literature Document 6: Japanese Patent Application Publication No. 2001-57513
Patent Literature Document 7: Japanese Patent Application Publication No. 2005-333182
Patent Literature Document 8: Japanese Patent Application Publication No. 2007-281633
Patent Literature Document 9: Japanese Patent Application Publication No. H11-136153
Patent Literature Document 10: Japanese Patent Application Publication No. 2000-209118
Patent Literature Document 11: Japanese Patent Application Publication No. 2008-193442
Patent Literature Document 12: Japanese Patent Application Publication No. 2006-115345
Patent Literature Document 13: Japanese Patent Application Publication No. 2005-167860
Patent Literature Document 14: Japanese Patent Application Publication No. 2009-147616

SUMMARY OF INVENTION

Technical Problem

The foregoing receiving devices suffer from the following problems.

FIG. 4 shows the receiving device which is designed to prevent saturation and secure backoff (i.e. a measure to transmit modulation signals having peak components without causing distortions) in the A/D converter 5 in the direct conversion system, the single conversion system, or the multiple conversion system. For this reason, it is necessary to make comparative judgment on the level detected with the RSSI 9 (i.e. a circuit used to monitor desired waves at the output side of the channel selecting filter 8) arranged in the output side of the A/D converter 5, and then the analog variable gain function part 6 arranged in the input side of the A/D converter 5 controls a gain reduction on desired waves exceeding the detected level. However, the receiving device suffers from the foregoing problems which are described with reference to FIG. 5.

First, the following problem raised by the receiving device receiving both a strong interfering wave and a low desired wave (close to the minimum sensitivity) will be described with reference to FIG. 5(b). Aiming to prevent saturation and secure backoff in the A/D converter 5, the analog variable gain function part 6 controls a gain reduction (−a [dB], −b [dB]) on an interfering wave exceeding the allowable threshold, while the analog variable gain function part 6 controls a gain reduction (−a [dB], −b [dB]) on a low desired wave close to the minimum sensitivity as similar to the interfering wave. This raises a problem in which the level of a desired wave will be decreased in the circuit portion subsequent to the A/D converter 5. Additionally, the level of an interfering wave is suppressed to be lower than the level of a desired wave when the channel selecting filter 8 transmits both the interfering wave and the desired wave therethrough so as to extremely attenuate the level of the interfering wave while the level of the desired wave input to the demodulator 12 is decreased to be lower than the minimum definition level; hence, the information of the desired wave below the minimum definition level of the demodulator 12 is truncated so that the information is partially lost, thus causing extreme degradation of demodulation or disability of demodulation.

To receive and modulate a low desired wave close to the minimum sensitivity along with a strong interfering wave by use of the foregoing receiving device, it is necessary to extremely increase the dynamic range necessary for the input level of the demodulator 12 while increasing the number of bits necessary for the demodulation process of the demodulator 12. This raises a problem in which the foregoing receiving device needs to increase the circuit scale while increasing power consumption.

The broadcasting receiving device of Patent Literature Document 4 may resemble the present invention in that the existence or nonexistence of an interfering wave is determined based on a difference between the levels of RSSI before and after the channel selecting filter. However, the broadcasting receiving device of Patent Literature Document 4, in which desired waves in the currently serving channel or desired waves in a plurality of channels including the current channel are captured and subjected to gain control in the RF amplifier based on the result of determining interfering waves, differs from the present invention in terms of the control method.

Details will be described by way of embodiments. The present invention reduces the gain of the analog variable gain function part (i.e. a first AGC-controlled subject) before and after ADC without causing distortions in the A/D converter (ADC) before the channel selecting filter during minimum-sensitivity reception involving strong interfering waves while detecting the existence of interfering waves based on a difference between the levels of RSSI before and after the channel selecting filter. To correct the low level of a desired wave at the modulation-enabled level, the present invention increases the gain of the digital variable gain function part serving as a second AGC-controlled subject.

The receiving device of Patent Literature Document 5 having a function of determining the existence or nonexistence of an interfering wave and the level of an interfering wave may resemble the present invention in that the existence or non-existence of an interfering wave is determined based on a difference between the levels of RSSI before and after the channel selecting filter. However, they differ from each other in terms of the control method. In contrast to the present invention which is able to vary an AGC control value based on the result of determining the existence or nonexistence of an interfering wave, the receiving device of Patent Literature Document 5 varies the voltage or current applied to LNA based on the result of determining the existence or nonexistence of an interfering wave, thus improving the linearity of LNA.

The receiving device of Patent Literature Document 6 having a function of determining the existence or nonexistence of an interfering wave and the level of an interfering wave may resemble the present invention in that the existence or non-existence of an interfering wave is determined based on a difference between the levels of RSSI before and after the channel selecting filter. However, they differ from each other in terms of the AGC control method. The present invention controls and varies the gain of the digital variable gain function part, preceding the demodulator, after the band limitation with the channel selecting filter. In contrast, the receiving device of Patent Literature Document 6 estimates the leakage of an interfering wave into a certain frequency range based on the level of an interfering wave and then subtracts the estimated leakage from an AGC feedback value applied to the analog variable gain function part preceding a band-pass filter (BPF) used for band limitation, thus appropriately correcting a gain control value applied to the analog variable gain function part based on the level of a desired wave.

The receiving device of Patent Literature Document 7 having a function of determining the existence or nonexistence of an interfering wave may resemble the present invention in that the existence or nonexistence of an interfering wave is determined based on a difference between the levels of RSSI before and after the channel selecting filter. However, they differ from each other in terms of the AGC control method. The present invention controls and varies the gain of the digital variable gain function part, preceding the demodulator, after the band limitation of the channel selecting filter based on the level of an interfering wave, thus inputting a desired wave having an appropriate level into the demodulator. In contrast, the receiving device of Patent Literature Document 7 changes the capacitance of the RSSI detection and rectifier circuit so as to achieve a variable response speed of AGC depending on the existence or nonexistence of an interfering wave. The receiving device of Patent Literature Document 7, which slows down the response speed of AGC due to the existence of an interfering wave, may offer an effect of suppressing unwanted fluctuations of an AGC gain in response to the rapidly varying level of an interfering wave. However, it may fix the AGC gain including an error depending on RSSI levels of interfering waves when strong interfering waves are constantly input thereto and continuously included in received radio waves for a long time; hence, it is impossible to obtain an appropriate reception output.

The receiving device of Patent Literature Document 8 may resemble the present invention in that saturation of ADC is prevented via the operation of RSSI 1, but differs from the present invention in terms of the operation of RSSI 2. That is, the receiving device of Patent Literature Document 8 does not determine the existence or nonexistence of an interfering wave but controls and varies the gain of a digital IF amplifier interposed between the BPF and the demodulator in order to keep the level of a desired wave before the demodulator within the predetermined level. In contrast, the present invention needs to estimate the existence or nonexistence of an interfering wave by way of comparative judgment on a difference between RSSI 1 and RSSI 2, thus controlling the gain of a digital AGC.

The second embodiment of Patent Literature Document 8 discloses an AGC control method using both RSSI 1 and RSSI 2. However, the second embodiment may raise the fear of degrading the reception sensitivity due to an unnecessary reduction in the level of a desired wave because it greatly increases the gain of LNA to prevent the saturation of AGC due to the very low level of a desired wave and the very high level of an interfering wave. On the other hand, Patent Literature Document 9 discloses a correction method which prevents a rapid decrease in the control voltage of LNA in order to alleviate a significant reduction in the gain of LNA, which is controlled based on the processing result of RSSI 1, when the level of a desired wave with RSSI 2 is extremely low.

The receiving device of Patent Literature Document 8 may have vulnerability in the operation of RSSI 2 because it assumes an interfering wave as a fundamental wave when the interfering wave is transmitted due to spurious response of BPF used for band limitation or the interfering wave reaches RSSI 2 without being adequately attenuated; hence, it may raise the fear of disabling demodulation of the fundamental wave when an error operation occurs to reduce the gain of digital AGC. In contrast, the present invention normally determines the existence or nonexistence of an interfering wave based on a level difference between RSSI 1 and RSSI 2, thus controlling the gain of digital AGC. Thus, it is possible to prevent an error operation of AGC when an interfering wave cannot be adequately eliminated.

To prevent the saturation of ADC, the second embodiment of Patent Literature Document 8 reduces the gain of LNA based on the processing result of RSSI 1 but controls the AGC to increase the gain of LNA based on the secondary determination of RSSI 2; this may entail an operational inconsistency. In contrast, the present invention prevents the saturation of ADC by way of the determination result of RSSI 1 alone but improves the gain due to a reduction in the level of a desired wave by way of feedback control of digital AGC after normally determining the existence or nonexistence of an interfering wave based on a difference between the levels of RSSI 1 and RSSI 2. Thus, the present invention independently controls the prevention of ADC saturation and the improvement of the gain due to a reduction in the level of a desired wave; hence, the present invention does not entail an operational inconsistency which occurs in Patent Literature Document 8.

The receiving device of Patent Literature Document 11 having a function of determining the existence or nonexistence of an interfering wave and the level of an interfering wave may resemble the present invention in that the existence or nonexistence of an interfering wave is determined based on a difference between the levels of RSSI before and after the channel selecting filter. However, they differ from each other in terms of the control method adopting the determination result. That is, the present invention performs AGC-varying control based on the result of determining the existence or nonexistence of an interfering wave, while the receiving device of Patent Literature Document 11 controls and varies a voltage and a current of LNA based on the result of determining the existence or nonexistence of an interfering wave, thus improving the linearity of LNA.

The receiving device of Patent Literature Document 12 may resemble the receiving device of Patent Literature Document 11, but they differ from each other in terms of the decision criterion. The receiving device of Patent Literature Document 12 switches to a circuit bypassing LNA so as to prevent the saturation of LNA when it detects a high level of an interfering wave by determining a difference between the levels of RSSI 1 and RSSI 2. In contrast, the present invention reduces the RF/IF gain of LNA to prevent the saturation of ADC by way of the determination of RSSI after ADC alone. The present invention may resemble Patent Literature Document 12 in that the existence or nonexistence of an interfering wave is determined based on a difference between the levels of RSSI 1 and RSSI 2, whereas the present invention compensates for a gain reduction, which prevents the saturation of ADC in the analog baseband part before ADC upon detecting the existence of an interfering wave, with the digital AGC amplifier.

Additionally, the receiving device of Patent Literature Document 12 achieves the gain compensation across the digital part and the analog part, wherein it bypasses the LNA of the analog part upon detecting the existence of an interfering wave while arranging an AGC amplifier in the analog baseband part so as to compensate for a gain reduction due to the bypass of LNA. That is, Patent Literature Document 12 differs from the present invention in that it implements the foregoing function in the analog part before ADC.

Moreover, the receiving device of Patent Literature Document 12 may show vulnerability causing an error operation in the AGC operation. For example, it is necessary to compensate for a gain in the analog baseband by increasing the gain of the AGC amplifier in the analog baseband when the LNA is bypassed upon detecting a high level of an interfering wave, wherein the level of an interfering wave detected with RSSI 1 likely matches with the level of an interfering wave detected with RSSI 2 when the input level of a desired wave is increased in this condition. In this case, it is impossible to obtain a difference between the levels of RSSI 1 and RSSI 2, and therefore the receiving device may erroneously recognize that a desired wave solely propagates on the level diagram due to dissipation of an interfering wave, thus incurring a risk of saturating LNA characteristics due to an interfering wave by releasing the bypass of LNA. In contrast, the present invention prevents saturation before ADC and determines a gain reduction by way of RSSI 1 in the output side of ADC while solely performing the determination of RSSI 1 alone, thus preventing an error operation. Additionally, it detects whether or not the level of an interfering wave is high based on a difference between the levels of RSSI 1 and RSSI 2, and therefore the digital AGC amplifier compensates for a gain reduction before ADC.

The present invention is made in consideration of the problems of the prior arts, and therefore it is an object of the invention to provide a gain control method and a receiving device equipped with an AGC (Automatic Gain Control) part which can reliably receive and demodulate desired waves, close to the minimum sensitivity, under environments of strong interfering waves.

Solution to Problem

The present invention is related to a receiving device which receives radio waves intermixing desired waves and interfering waves so as to carry out automatic gain control and demodulation. The receiving device includes a low noise amplifier for amplifying received waves; an intermediate frequency converter for converting a received signal, which is output from the low noise amplifier, into an intermediate frequency signal by use of a local oscillator frequency; an analog variable gain function part for amplifying the intermediate frequency signal with a first gain; an A/D converter for performing analog-to-digital conversion on the intermediate frequency signal amplified with the analog variable gain function part; a channel selecting filter for filtering out a frequency band of a specific channel from a digital signal output from the A/D converter; a digital variable gain function part for amplifying the digital signal of the specific channel, filtered by the channel selecting filter, with a second gain; a first RSSI part for detecting a first received signal strength from the digital signal output from the A/D converter; a second RSSI part for detecting a second received signal strength from the digital signal of the specific channel filtered by the channel selecting filter; a comparison controller for calculating the first gain applied to the analog variable gain function part based on a part of the first received signal strength exceeding an allowable threshold, and for calculating the second gain applied to the digital variable gain function part based on the first gain set to the analog variable gain function part when a level difference between the first received signal strength and the second received signal strength exceeds the allowable threshold; and a demodulator for demodulating the digital signal amplified with the digital variable gain function part.

The present invention is related to a gain control method adapted to a receiving device which receives radio waves intermixing desired waves and interfering waves so as to perform automatic gain control and demodulation. In the gain control method, received waves are subjected to low noise amplification to generate a received signal; a received signal is converted into an intermediate frequency signal by use of a local oscillator frequency; the intermediate frequency signal is amplified with a first gain; the intermediate frequency signal is converted into a digital signal; a frequency band of a specific channel is filtered out from the digital signal; the digital signal of the specific channel is amplified with a second gain; the first received signal strength is detected from the digital signal; the second received signal strength is detected from the digital signal of the specific channel; the first gain is calculated based on the first received signal strength exceeding the allowable threshold; the second gain is calculated when a level difference between the first received signal strength and the second received signal strength exceeds the allowable threshold; and then the digital signal of the specific channel amplified with the second gain is demodulated.

Advantageous Effects of Invention

The present invention refers to the receiving device and the gain control method, wherein it is possible to increase the level of a desired wave input to the demodulator to be above the minimum definition level under environments undergoing strong interfering waves. Thus, it is possible to reliably receive and demodulate desired waves, close to the minimum sensitivity, with appropriate levels. Additionally, it is possible to decrease the dynamic range necessary for the demodulator when receiving desired waves, close to the minimum sensitivity, under environments undergoing strong interfering waves. This eliminates the necessity of increasing the circuit scale of the receiving device while reducing power consumption.

DESCRIPTION OF EMBODIMENTS

Figure 1:
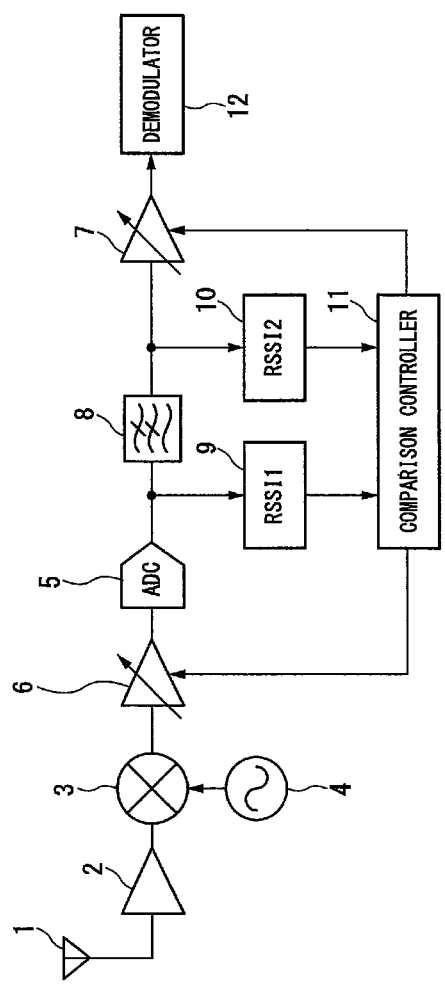
FIG. 1 is a block diagram of a receiving device according to a first embodiment of the present invention.

The present invention refers to a receiving device and a gain control method, which will be described in detail by way of examples with reference to the accompanying drawings.

The present invention prevents saturation and secures backoff in the A/D converter (ADC) based on the direct conversion system, the single conversion system, or the multiple conversion system. For this reason, the comparison controller arranged in the input side of ADC determines the received signal strength detected with RSSI (Received Signal Strength Indicator), and therefore it is necessary to control a gain reduction in the analog variable gain function part arranged in the input side of ADC with respect to a part of the received signal strength exceeding the allowable threshold.

To suppress interfering waves, it is necessary for RSSI 1 and RSSI 2 to detect signal levels before and after the channel selecting filter arranged in the digital baseband part after ADC, and it is necessary for the comparison controller to compare a difference between the levels of signals with the allowable threshold, thus determining the existence or nonexistence of interfering waves. For example, it is possible to determine the existence of an interfering wave due to a large difference between the levels of RSSI 1 and RSSI 2, while it is possible to determine the nonexistence of an interfering wave due to a small difference between the levels. Upon determining the existence of an interfering wave, it is necessary to compensate for a gain reduction in the analog variable gain function part by increasing the gain of the digital variable gain function part interposed between the channel selecting filter and the demodulator. Upon determining the nonexistence of an interfering wave, it is necessary to set the gain of the digital variable gain function part to "0 dB" (i.e. a multiplying factor of ×1 in terms of a true value), thus preventing gain control.

According to the aforementioned gain control method, it is possible to increase the level of a desired wave input to the demodulator to be above the minimum definition level of the demodulator irrespective of the existence or nonexistence of an interfering wave. In particular, even when a desired wave, close to the minimum sensitivity, accompanied with a strong interfering wave arrives at the receiving device, it is possible to forward the desired wave to the circuit portion subsequent to the demodulator while securing a desired C/N ratio (i.e. while preventing the minimum definition level of the demodulator from being assumed as the noise level).

As described above, a desired wave accompanied with a strong interfering wave is increased to be higher than a desired C/N ratio and input to the demodulator while the interfering wave is suppressed to be lower than the noise level; hence, it is possible to achieve a good demodulation process without causing a reduction of the reception sensitivity. According to the reception method used to receive desired waves, close to the minimum sensitivity, accompanied with strong interfering waves, it is possible to decrease the dynamic range (i.e. the number of bits in needs) necessary for the demodulator; hence, it is possible to eliminate the necessity of increasing the circuit scale, thus reducing power consumption.

First Embodiment

FIG. 1 is a block diagram of a receiving device according to the first embodiment of the present invention. The receiving device includes an antenna 1, a LNA 2, a mixer 3, a local oscillator 4, an A/D converter (ADC) 5, an analog variable gain function part 6, a digital variable gain function part 7, a channel selecting filter 8, a first received signal strength indicator (RSSI 1) 9, a second received signal strength indicator (RSSI 2) 10, a comparison controller 11, and a demodulator 12.

Next, the constituent elements of the receiving device will be described in detail.

First, radio waves (i.e. desired waves and interfering waves) received with the antenna 1 are subjected to low noise amplification with the LNA 2 and then mixed down to a near-zero intermediate frequency (i.e. near-zero IF) or a zero intermediate frequency (zero IF) by way of the mixer 3 and the local oscillator 4. Herein, the zero IF is an analog baseband frequency. The A/D converter 5 performs under-sampling in the case of the near-zero IF, while the direct conversion system is employed in the zero IF.

Next, an intermediate frequency signal (i.e. an IF signal or an analog baseband signal) is subjected to A/D conversion with the A/D converter 5 and then supplied to the demodulator 12. To prevent desired waves from being distorted when mixed waves intermixing desired waves and interfering waves are propagating through the A/D converter 5, it is necessary for mixed waves to propagate through the A/D converter 5 under an appropriate level securing backoff below the full range level of the A/D converter 5. For this reason, it is necessary to perform comparative judgment the received signal strength detected with the RSSI 1 (9) arranged in the output side of the A/D converter 5, and it is necessary to control a gain reduction on the analog variable gain function part 6 arranged in the input side of the A/D converter 5 with respect to a part of the received signal strength exceeding an allowable threshold.

Figure 2:
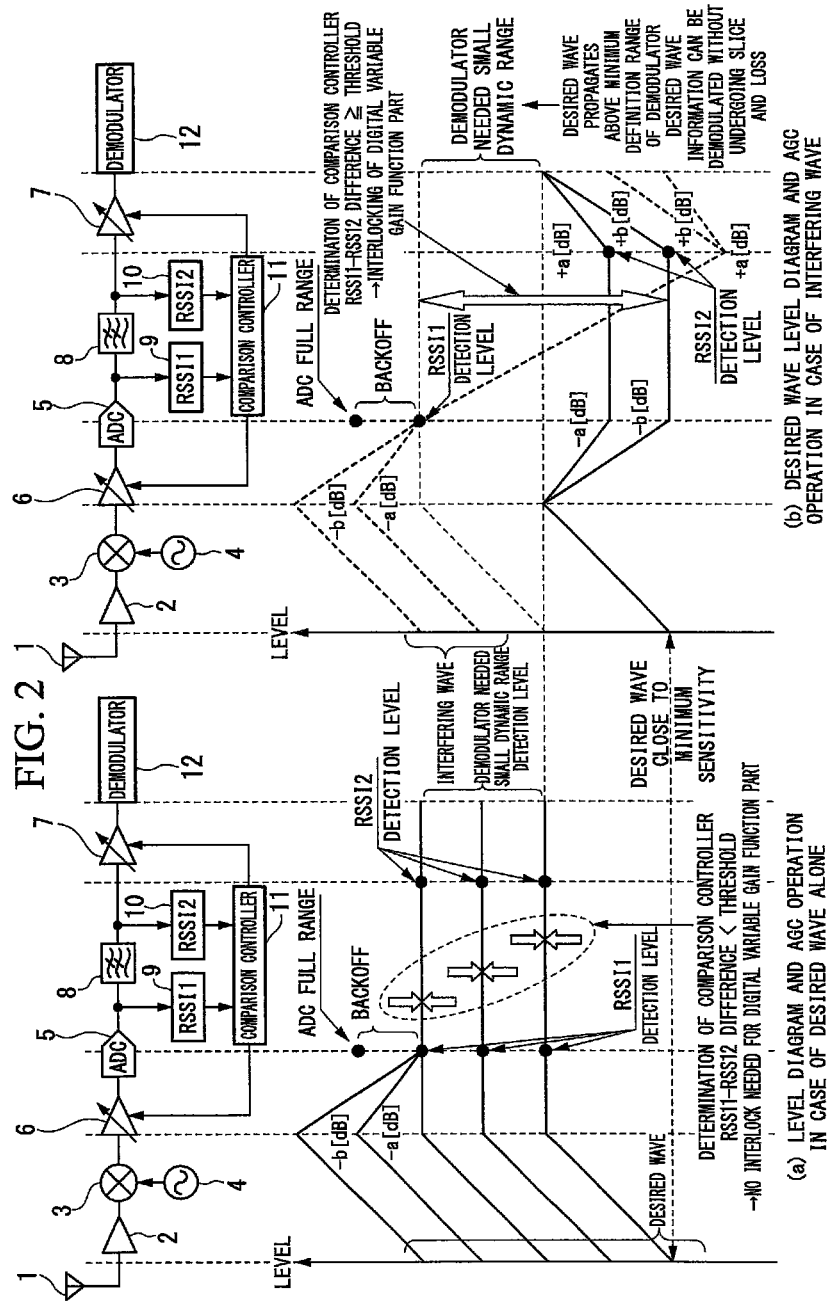
FIG. 2(a) is an explanatory diagram showing the level diagram and the AGC operation in the case of the receiving device receiving desired waves alone.
FIG. 2(b) is an explanatory diagram showing the level diagram and the AGC operation in the case of the receiving device receiving both desired waves and interfering waves.

For example, the comparison controller 11 is able to set a gain, which is varied in proportion (or roughly proportion) to a part of the received signal strength of RSSI 1 (9) exceeding the allowable threshold, to the analog variable gain function part 6. In this connection, FIG. 2 shows an AGC gain control method for the receiving device by way of a gain control method for the analog variable gain function part 6 on the level diagram, which is described independently with respect to a gain-applying mode (i.e. Gain=0 dB in FIG. 2) and an attenuation mode (i.e. −a [dB], −b [dB] in FIG. 2). When mixed waves intermixing desired waves and interfering waves propagate through the configuration including the A/D converter 5 and the channel selecting filter 8 (i.e. an LPF configuration assuming near-zero IF or zero IF), desired waves solely propagate through the channel selecting filter 8 with a small loss while interfering waves are significantly attenuated with the channel selecting filter 8 and suppressed to the low level which may not degrade the demodulation process of desired waves.

Thus, mixed waves intermixing desired waves and interfering waves may exist in the input side of the channel selecting filter 8, while desired waves may solely exist in the output side of the channel selecting filter 8 due to adequate attenuation of interfering waves. The first embodiment detects the input level of the channel selecting filter 8 with the RSSI 1 (9), detects the output level of the channel selecting filter 8 with the RSSI 2 (10), and then supplies them to the comparison controller 11. The comparison controller 11 subtracts the detected level of the RSSI 2 (10) from the detected level of the RSSI 1 (9) so as to estimate the existence of interfering waves.

The comparison controller 11 determines "existence of interfering waves" due to a larger level difference between the RSSI 1 (9) and the RSSI 2 (10) than the allowable threshold while determining "nonexistence of interfering waves" or "interfering waves with negligible low levels" due to a smaller level difference between them than the allowable threshold. To keep desired waves input to the demodulator 12 based on the existence or nonexistence of interfering waves within an appropriate level, the comparison controller 11 controls a gain increase on the digital variable gain function part 7 following the channel selecting filter 8. This configuration contributes to a feature of the first embodiment in comparison with the prior art.

For example, the comparison controller 11 sets a gain, which is varied in proportion (or roughly proportion) to a level difference between the RSSI 1 (9) and the RSSI 2 (10) exceeding the allowable threshold, to the digital variable gain function part 7. Additionally, the comparison controller 11 is able to set the minimum gain as "a multiplying factor 1" via multiplication scaling.

It is possible to keep desired waves input to the demodulator 12 within an appropriate level because desired waves (where interfering waves have been already attenuated to a low level not affecting the demodulation process of the channel selecting filter 8) propagating through the channel selecting filter 8 are controlled in level via the digital variable gain function part 7.

In a concrete gain control method of the digital variable gain function part 7, it is necessary to perform AGC control to restore the original level of desired waves, which was temporarily reduced, by increasing the gain of the digital variable gain function part 7 (i.e. +a [dB], +b [dB]) by a gain reduction of the analog variable gain function part 6 (i.e. −a [dB], −b [dB]), which is needed to prevent the saturation of the A/D converter 5 due to interfering waves when the comparison controller 11 detects the existence of interfering waves. When the comparison controller 11 fails to detect interfering waves, the comparison controller 11 determines that the gain of the analog variable gain function part 6 is reduced (i.e. −a [dB], −b [dB]) to prevent the saturation of the A/D converter 5 due to desired waves, and therefore it supplies desired waves to the demodulator 12 while maintaining their levels without controlling the gain of the digital variable gain function part 7 (i.e. 0 dB). In other words, when desired waves are being input with high levels, it is necessary to further increase their levels with the last stage of the circuitry, i.e. the digital variable gain function part 7, so as to perform AGC control preventing clipping of the input level of the demodulator 12 and the saturation of the demodulator 12.

Owing to the aforementioned AGC control, the receiving device of the first embodiment is able to increase the level of desired waves input to the demodulator 12 to be above the minimum definition level of the demodulator 12 irrespective of the existence or nonexistence of interfering waves. In particular, upon receiving desired waves, close to the minimum sensitivity, accompanied with strong interfering waves, the receiving device is able to send desired waves to the circuit portion subsequent to the demodulator 12 while securing a desired C/N ratio or more (i.e. without assuming the minimum definition level of the demodulator 12 as the noise level). Upon receiving desired waves, close to the minimum sensitivity, accompanied with strong interfering waves, the receiving device is able to decrease the dynamic range (i.e. the number of bits) necessary for the demodulator 12; hence, it is possible to simplify the circuit configuration while decreasing power consumption.

Next, the operation of the receiving device of the first embodiment will be described in detail. FIG. 2 is an explanatory diagram showing the operation of the receiving device of the present embodiment. Herein, FIG. 2(a) shows the level diagram and the AGC operation in the case of the existence of desired waves alone, while FIG. 2(b) shows the level diagram and the AGC operation in the case of the existence of desired waves and interfering waves.

As shown in FIG. 2(a) indicating the existence of desired waves alone, when desired waves are increased in level from the minimum sensitivity level, the comparison controller 11 makes comparative judgment on the level of desired waves detected with the RSSI 1 (9) in the AGC loop and then controls a gain reduction of the analog variable gain function part 6 (−a [dB], −b [dB]) to prevent saturation and secure backoff in the A/D converter 5 with respect to desired waves exceeding the allowable threshold.

To suppress interfering waves, the RSSI 1 (9) and the RSSI 2 (10) monitors the signal levels before and after the channel selecting filter 8 arranged in the digital baseband part, and then the comparison controller 11 compares the level difference between them with the allowable threshold so as to determine the existence or nonexistence of interfering waves. Herein, the comparison controller 11 determines "existence of interfering waves" due to a large level difference between the RSSI 1 (9) and the RSSI 2 (10), while it determines "nonexistence of interfering waves" due to a small difference between them.

In the case of FIG. 2(a) showing no level difference between the RSSI 1 (9) and the RSSI 2 (10), the comparison controller 11 determines "nonexistence of interfering waves", determines a gain reduction of the analog variable gain function part 6 (−a [dB], −b [dB]) to prevent the saturation of the A/D converter 5 due to desired waves, and supplies desired waves to the demodulator 12 while maintaining their levels without controlling the gain of the digital variable gain function 7 (i.e. a gain "0 dB").

As shown in FIG. 2(a), the level of desired waves input to the demodulator 12 is above the minimum definition level of the demodulator 12. That is, it is possible to perform demodulation while maintaining the C/N ratio to the noise level, which is necessary for the demodulation process of desired waves, because the level of desired waves input to the demodulator 12 is below the minimum definition level. Additionally, the receiving device receiving desired waves alone may keep a small dynamic range necessary to secure the input level of the demodulator 12.

As shown in FIG. 2(b), when interfering waves are increased in level while the receiving device receives desired waves, close to the minimum sensitivity, accompanied with strong inferring waves, interfering waves instead of desired waves become dominant and will be detected with the RSSI 1 (9) in the AGC loop. In this case, the comparison controller 11 making comparative judgment controls a gain reduction (−a [dB], −b [dB]) of the analog variable gain function part 6 in order to prevent saturation and secure backoff in the A/D converter 5 due to interfering waves with respect to interfering waves exceeding the allowable threshold. Additionally, it controls a gain reduction of the analog variable gain function part 6 (−a [dB], −b [dB]) with respect to desired waves, close to the minimum sensitivity, as similarly to interfering waves, thus decreasing the level of desired waves in the circuit portion subsequent to the A/D converter 5.

When interfering waves and desired waves propagate through the channel selecting filter 8, interfering waves are extremely reduced in level and suppressed to be lower than desired waves in level. The conventionally-known receiving device, which may keep the level of desired waves input to the demodulator 12 to be lower than the minimum definition level, may raise the fear of extremely degrading demodulation or disabling demodulation because the information of desired waves under the minimum definition level of the demodulator 12 are cut out and partially dissipated. To solve the drawback in the receiving device of the first embodiment, the RSSI 1 (9) and the RSSI 2 (10) monitor the signal levels before and after the channel selecting filter 8 arranged in the digital baseband part in order to suppress interfering waves, wherein the comparison controller 11 makes comparative judgment on the level difference between them so as to determine the existence or nonexistence of interfering waves.

Specifically, in the case of FIG. 2(b), the comparison controller 11 determines "existence of interfering waves" upon detecting a larger level difference between the RSSI 1 (9) and the RSSI 2 (10) than the allowable threshold. In this case, the comparative controller 11 determines that the gain of the analog variable gain function part 6 is reduced (−a [dB], −b [dB]) to prevent the saturation of the A/D converter 5 due to interfering waves, and therefore the gain of the digital variable gain function 7 is increased (+a [dB], +b [dB]) by a gain reduction, thus performing AGC control to restore the original level of desired waves, which was temporarily reduced.

As shown in FIG. 2(b) in which desired waves are being input to the demodulator 12 with their levels above the minimum definition level by way of the AGC control of the digital variable gain function part 7 based on the result of determining the existence or nonexistence of interfering waves, the information of desired waves below the minimum definition level of the demodulator 12 is not necessarily cut out or defected; hence, it is possible for the receiving device to receive and demodulate desired waves, close to the minimum sensitivity, without degrading demodulator or disabling demodulation in environments undergoing strong interfering waves.

Second Embodiment

Figure 3:
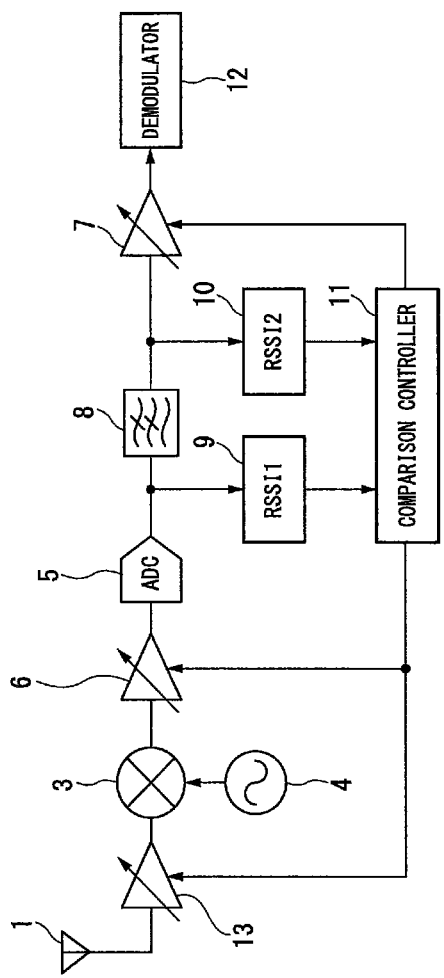
FIG. 3 is a block diagram of a receiving device according to a second embodiment of the present invention.
Figure 4:
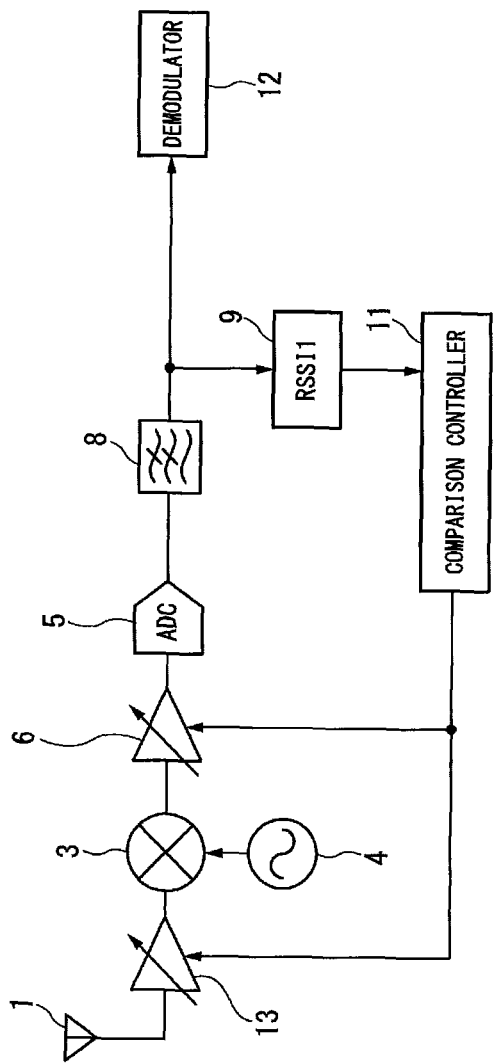
FIG. 4 is a block diagram of a conventionally-known receiving device.
Figure 5:
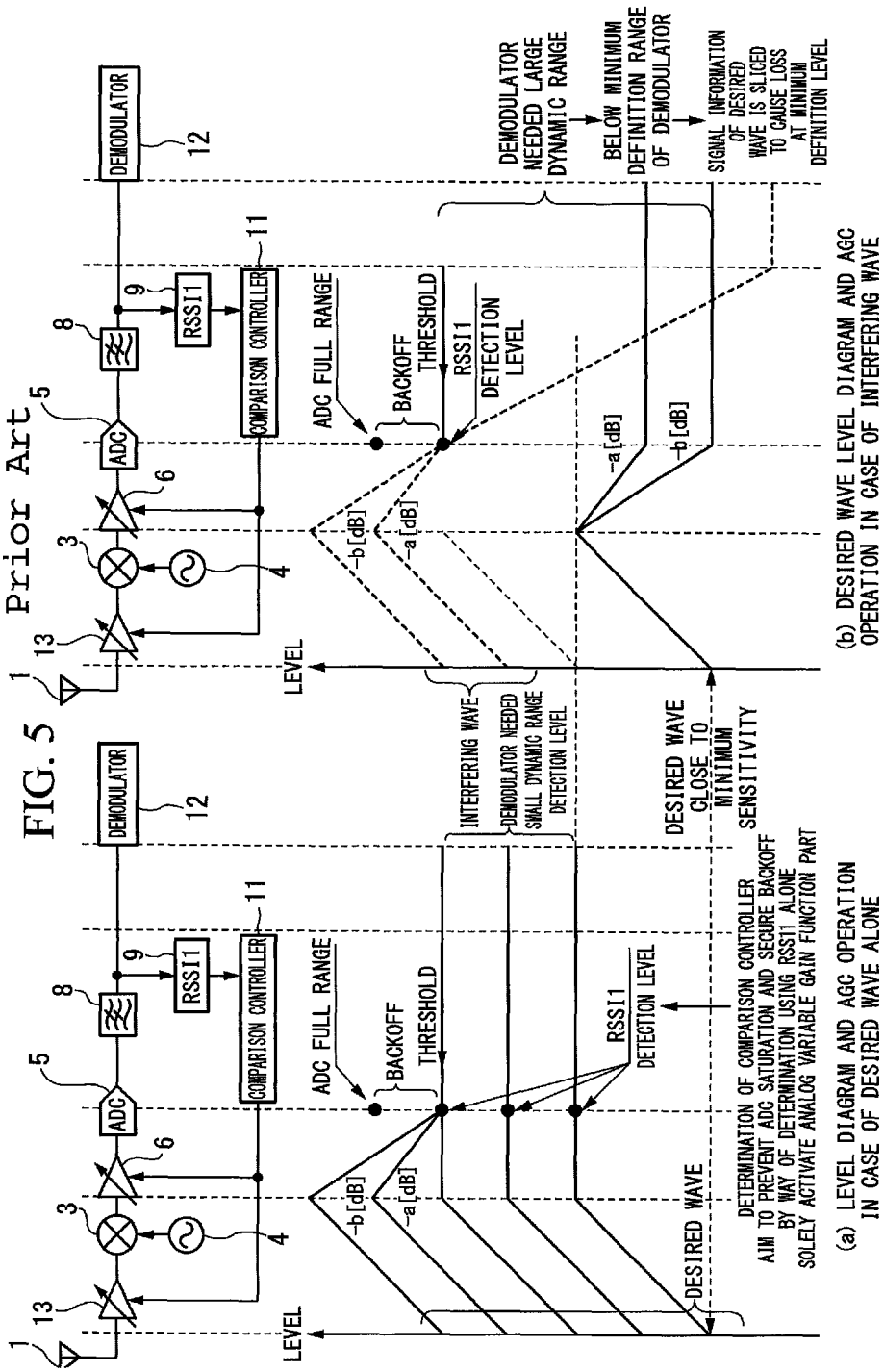
FIG. 5(a) is an explanatory diagram showing the level diagram and the AGC operation in the case of the receiving device receiving desired waves alone.
FIG. 5(b) is an explanatory diagram showing the level diagram and the AGC operation in the case of the receiving device receiving low desired waves together with strong interfering waves.
Figure 6:
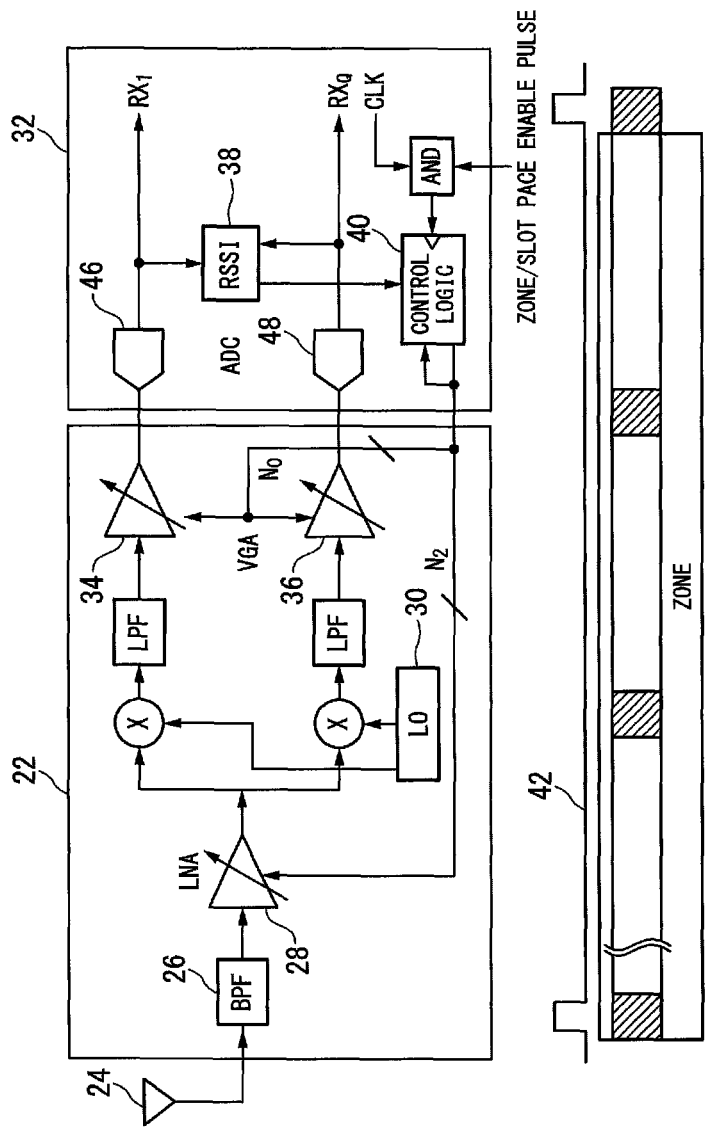
FIG. 6 is a block diagram of another conventionally-known receiving device.

FIG. 3 is a block diagram of a receiving device according to the second embodiment of the present invention. In FIG. 3, the same constituent elements as those in FIG. 1 are designated using the same reference signs. The receiving device of the second embodiment differs from the receiving device of the first embodiment in that the LNA 2 is replaced with an LNA 13 having a variable gain function. Additionally, the comparison controller 11 controls the gain of the LNA 13.

In the receiving device of the second embodiment, the comparison controller 11 makes comparative judgment on the level detected with the RSSI 1 (9), arranged in the output side of the A/D converter 5, in order to prevent saturation and secure backoff in the A/D converter 5, while the gains of the LNA 13 and the analog variable gain function part 6 are reduced with respect to interfering waves exceeding the allowable threshold. That is, it controls a gain reduction with the LNA 13 in addition to the analog variable gain function part 6 in order to cope with interfering waves exceeding the allowable threshold.

As described above, the receiving device of the present invention carries out AGC control based on the result of determining the existence or nonexistence of interfering waves; hence, it is possible to increase the level of desired waves input to the demodulator to be above the minimum definition level irrespective of the existence or nonexistence of interfering waves. In particular, it is possible to send desired waves to the circuit portion subsequent to the demodulator while securing a desired C/N ratio even when desired waves are decreased around the minimum definition sensitivity in environments undergoing strong interfering waves.

When the receiving device of the present invention is applied to portable terminal devices in uplink lines of base stations, it is possible to demodulate desired waves without depending on the distance (far and near) between potable terminal devices, and therefore it is possible to secure wide dynamic ranges in reception and adequate resistance to interference (i.e. resistance to suppression of reception sensitivity). In the process of receiving desired waves, close to the minimum sensitivity, in environments undergoing strong interfering waves, it is possible for the reception configuration of the present invention to reduce the dynamic range (i.e. the number of bits) necessary for the demodulator, and therefore it is possible to eliminate the necessity of increasing the circuit scale while reducing power consumption.

In this connection; the configuration of the receiving device of the present invention is not necessarily limited to the first embodiment and the second embodiment; hence, the present invention may embrace a variety of modifications within the scope of the invention as defined by the appended claims.

INDUSTRIAL APPLICABILITY

The receiving device of the present invention is able to reliably receive and demodulate desired waves, close to the minimum sensitivity, irrespective of the existence or nonexistence of interfering waves; hence, the present invention is applicable to cellular phones and base stations in mobile communication systems, base stations in fixed communication networks, land stations in satellite communication systems, and receiving terminal devices in broadcasting systems.

REFERENCE SIGNS LIST 1 antenna
2 LNA (low noise amplifier)
3 mixer
4 local oscillator
5 A/D converter
6 analog variable gain function part
7 digital variable gain function part
8 channel selecting filter
9 RSSI 1
10 RSSI 2
11 comparison controller
11 demodulator

The invention claimed is:

1. A receiving device which receives radio waves intermixing desired waves and interfering waves so as to carry out automatic gain control and demodulation, the receiving device comprising:
a low noise amplifier which amplifies a received wave;
an intermediate frequency converter which converts a received signal, output from the low noise amplifier, into an intermediate frequency signal by use of an local oscillator frequency;
an analog variable gain function part which amplifies the intermediate frequency signal with a first gain;
an analog-to-digital (A/D) converter which performs analog-to-digital conversion on the intermediate frequency signal amplified with the analog variable gain function part;
a channel selecting filter which filters out a frequency band of a specific channel from a digital signal output from the A/D converter;
a digital variable gain function part which amplifies the digital signal of the specific channel, filtered by the channel selecting filter, with a second gain;
a first received signal strength indicator (RSSI) part which detects a first received signal strength from the digital signal output from the A/D converter;
a second RSSI part which detects a second received signal strength from the digital signal of the specific channel filtered by the channel selecting filter;
a comparison controller which calculates the first gain applied to the analog variable gain function part based on a part of the first received signal strength exceeding an allowable threshold and which calculates the second gain applied to the digital variable gain function part based on the first gain set to the analog variable gain function part when a level difference between the first received signal strength and the second received signal strength exceeds the allowable threshold; and
a demodulator which demodulates the digital signal amplified with the digital variable gain function part.

2. The receiving device according to claim 1, wherein the comparison controller calculates a third gain applied to the low noise amplifier based on a part of the first received signal strength exceeding the allowable threshold.

3. The receiving device according to claim 1, wherein the comparison controller calculates the first gain in proportion to or in roughly proportion to a part of the first received signal strength exceeding the allowable threshold.

4. The receiving device according to claim 1, wherein the comparison controller calculates the second gain based on the first gain set to the analog variable gain function part when the level difference between the first received signal strength and the second received signal strength exceeds the allowable threshold.

5. The receiving device according to claim 4, wherein the comparison controller sets the second gain to a multiplying factor 1 via multiplication scaling when the level difference between the first received signal strength and the second received signal strength is smaller than the allowable threshold.

6. A gain control method adapted to a receiving device which receives radio waves intermixing desired waves and interfering waves so as to perform automatic gain control and demodulation, the gain control method comprising:
generating a received signal by way of low noise amplification on a received wave;
converting the received signal into an intermediate frequency signal by use of a local oscillator frequency;
amplifying the intermediate frequency signal with a first gain;
converting the intermediate frequency signal into a digital signal;
filtering out a frequency band of a specific channel from the digital signal;
amplifying the digital signal of the specific channel with a second gain;
detecting a first received signal strength from the digital signal;
detecting a second received signal strength from the digital signal of the specific channel;

calculating the first gain based on a part of the first received signal strength exceeding an allowable threshold;

calculating the second gain when a level difference between the first received signal strength and the second received signal strength exceeds the allowable threshold; and demodulating the digital signal of the specific channel amplified with the second gain.

7. The gain control method according to claim 6, wherein a third gain is calculated based on a part of the first received signal strength exceeding the allowable threshold, thus performing low noise amplification on the received wave with the third gain.

8. The gain control method according to claim 6, wherein the first gain is calculated in proportion to or in roughly proportion to a part of the first received signal strength exceeding the allowable threshold.

9. The gain control method according to claim 6, wherein the second gain is calculated when the level difference between the first received signal strength and the second received signal strength exceeds the allowable threshold.

10. The gain control method according to claim 9, wherein the second gain is set to a multiplying factor 1 via multiplication scaling when the level difference between the first received signal strength and the second received signal strength is smaller than the allowable threshold.

* * * * *